(12) United States Patent
Wu

(10) Patent No.: US 8,958,160 B2
(45) Date of Patent: Feb. 17, 2015

(54) LENS AND PATTERN PRINTING AND COATING METHOD FOR MANUFACTURING SAME

(75) Inventor: Chih-Ming Wu, Dongguan (CN)

(73) Assignee: Dongguan Koda Optical Lens Co., Ltd., Dongguan, Guangdong (CN)

( * ) Notice: Subject to any disclaimer, the term of this patent is extended or adjusted under 35 U.S.C. 154(b) by 0 days.

(21) Appl. No.: 13/549,850

(22) Filed: Jul. 16, 2012

(65) Prior Publication Data

US 2013/0155523 A1    Jun. 20, 2013

(30) Foreign Application Priority Data

Dec. 19, 2011    (CN) .......................... 2011 1 0424752
Jun. 26, 2012    (CN) .......................... 2012 1 0211701

(51) Int. Cl.
| | | |
|---|---|---|
| G02B 1/06 | (2006.01) | |
| G02B 3/12 | (2006.01) | |
| G02B 5/128 | (2006.01) | |
| G02B 5/18 | (2006.01) | |
| G02B 1/10 | (2006.01) | |
| G02B 5/08 | (2006.01) | |

(52) U.S. Cl.
USPC ........... 359/667; 359/541; 359/570; 359/580; 359/581; 359/870

(58) Field of Classification Search
USPC .......... 359/667, 576, 541, 580, 581, 870, 884
See application file for complete search history.

(56) References Cited

U.S. PATENT DOCUMENTS

2003/0035972 A1\* 2/2003 Hanson et al. ................ 428/480
2012/0026456 A1\* 2/2012 Nishimoto et al. ........... 351/159

\* cited by examiner

*Primary Examiner* — Ricky Mack
*Assistant Examiner* — Mustak Choudhury
(74) *Attorney, Agent, or Firm* — Jackson IPG PLLC

(57) ABSTRACT

The invention discloses a lens, which comprises an outer surface and an inner surface, wherein a pattern outline is printed on the outer surface; and an argon gas layer, a high refractive index layer, a lower refractive index layer and a waterproof layer are evaporated at an area, outside the pattern outline, of the outer surface from inside to outside in turn. By adoption of clear patterns formed on the outer surface by the manufacturing processes and a four-layer vacuum electroplating film evaporated at an area, outside the pattern outline, of the outer surface, the coating does not block the sight and the lens is more beautiful and has the functions of radiation resistance and ultraviolet resistance. The invention also discloses a pattern printing and vacuum electroplating method which has simple and efficient processes and realizes the functions of the coated lens.

6 Claims, 2 Drawing Sheets

LENS AND PATTERN PRINTING AND COATING METHOD FOR MANUFACTURING SAME

FIELD OF THE INVENTION

The invention belongs to the technical field of optical materials, in particular relates to a plurality of lenses made of transparent and plastic materials and a pattern printing and coating method for manufacturing the same. The invention can be applied to pattern printing and coating manufacturing processes of common optical lenses, sunglass lenses, windproof lenses and the like.

BACKGROUND OF THE INVENTION

With the advance of the times, the pursuit of fashion by people, and the innovation of spectacles products, the product design is not limited to spectacles frames and begins to advance towards the combination of lens design and spectacles frame design. A large number of people are engaged in lens pattern process design in recent years. However, as the sight can be blocked by patterns printed on lenses and the patterns printed on cambered surfaces of the lenses tend to be deformed, the obtained products cannot be accepted by consumers and partial products even cannot meet the examination requirements.

SUMMARY OF THE INVENTION

The object of the invention is to overcome the defects in the prior art and provide a coated lens, wherein clear patterns can be formed on the lens by the manufacturing processes and does not block the sight; and the lens is more beautiful and has the functions of radiation resistance and ultraviolet resistance.

The other object of the invention is to provide a pattern printing and vacuum electroplating method which has simple and efficient processes and realizes the functions of the coated lens.

The object of the invention is realized as follows:

A lens, comprising an outer surface and an inner surface, wherein a pattern outline is printed on the outer surface; and an argon gas layer, a high refractive index layer, a lower refractive index layer and a waterproof layer are evaporated at an area, outside the pattern outline, of the outer surface from inside to outside in turn. By adoption of clear patterns formed on the outer surface of the lens and a four-layer coating evaporated at an area, outside the pattern outline, of the outer surface, the coating does not block the sight and the lens is more beautiful and has the functions of radiation resistance and ultraviolet resistance.

Preferably, an argon gas layer, a high refractive index layer, a low refractive index layer and a waterproof layer can also be coated on the inner surface of the lens from inside to outside.

Preferably, the pattern outline is set by printing resin ink on the outer surface of the lens during the evaporation of the outer surface of the lens; the high refractive index layer is zirconium dioxide; the low refractive index layer is silicon dioxide; and the waterproof layer is a water-drawing agent.

The other object of the invention is realized as follows:

A pattern printing and coating method for manufacturing the lens according to claim 1, comprising the following steps of:

step 1: pretreatment of lenses, wherein outer surfaces and inner surfaces of the lenses are examined; and dust, fingerprints and dirt must be removed from the lenses besides finding out defective lenses, so as to avoid the defects of light leakage and ink leakage after printing;

step 2: printing of resin ink, wherein pattern outlines are set by printing the resin ink on the outer surfaces of the lenses through a transfer printing machine or a screen printer;

step 3: examination and repair of the resin ink printed, wherein whether the resin ink has the defects of missing print, ink leakage, unclear border lines, uneven edges and ghosting is examined, and the defects are properly repaired and cleaned by a repair tool;

step 4: coating at areas, outside the pattern outlines, of the outer surfaces of the lenses, wherein argon gas layers, high refractive index layers, low refractive index layers and waterproof layers are evaporated at the areas, outside the pattern outlines, of the outer surfaces of the lenses from inside to outside in turn in a vacuum coating machine; and step 5: ultrasonic cleaning, wherein the lens is subjected to ultrasonic cleaning in filtered and clean cold water first and then cleaned in hot water to remove the resin ink on the outer surface.

According to the preferred embodiments of the invention, in the step 4, during the coating at the areas, outside the pattern outlines, of the outer surfaces of the lenses, firstly, the lenses for coating are arranged towards the outer surfaces; secondly, vacuum pumping is performed by an electrostatic gun for 20 to 35 minutes; and thirdly, coating is performed under the vacuum pressure of $1.0 \times 10^{-5}$, wherein argon gas is evaporated by an ion gun for 3 to 8 minutes for first layers; high refractive index materials are evaporated for 5 to 10 minutes for second layers; low refractive index materials are evaporated for 3 to 8 minutes for third layers; and waterproof materials are evaporated for 2 to 6 minutes for fourth layers.

According to the preferred embodiments of the invention, in the step 4, argon gas layers, high refractive index layers, low refractive index layers and waterproof layers are evaporated on the inner surfaces of the lenses from inside to outside in turn in the vacuum coating machine.

According to the preferred embodiments of the invention, in the step 4, during the vapor deposition of the outer surfaces and the inner surfaces of the lenses, firstly, the argon gas layers, the high refractive index layers and the low refractive index layers are evaporated on the firstly evaporated surfaces of the lenses; secondly, the argon gas layers, the high refractive index layers, the low refractive index layers and the waterproof layers are evaporated on the other surfaces of the lenses; and thirdly, the waterproof layers are evaporated on the firstly evaporated surfaces of the lenses.

According to the preferred embodiments of the invention, in the step 4, during the vapor deposition of the outer surfaces and the inner surfaces of the lenses, firstly, the lenses for coating are arranged towards the outer surfaces; vacuum pumping is performed by the electrostatic gun for 20 to 35 minutes; coating is performed under the vacuum pressure of $1.0 \times 10^{-5}$, wherein the argon gas is evaporated by the ion gun for 3 to 8 minutes for the first layers; the high refractive index materials are evaporated for 5 to 10 minutes for the second layers; the low refractive index materials are evaporated for 3 to 8 minutes for the third layers; and the obtained product is for standby.

Secondly, the lenses are arranged towards the inner surfaces; dust is removed by the electrostatic gun; vacuum pumping is performed in an electroplating furnace for 20 to 35 minutes; and coating is performed under the vacuum pressure of $1.0 \times 10^{-5}$, wherein the argon gas is evaporated by the ion gun for 3 to 8 minutes for first layers; the high refractive index materials are evaporated for 5 to 10 minutes for second layers; the low refractive index materials are evaporated for 5 to 10 minutes for third layers; and the waterproof materials are evaporated for 2 to 6 minutes for fourth layers;

Thirdly, the lenses are arranged towards the outer surfaces; dust is removed by the electrostatic gun; vacuum pumping is performed for 12 to 18 minutes; and the waterproof materials are evaporated for 2 to 6 minutes under the vacuum pressure of $2.0\times10^{-5}$.

According to the preferred embodiments of the invention, before the pretreatment of the lenses in the step 1, the lenses are soaked in an antifogging agent and taken out and dried, so as to have the antifogging function.

According to the preferred embodiments of the invention, during the printing of the resin ink in the pattern outlines in the step 2, the resin ink is printed on small-size lenses by the transfer printing machine and on large-size lenses by the screen printer.

During the printing of the resin ink by the transfer printing machine, firstly, water-soluble resin ink is filled into a standby ink groove for the transfer printing machine; secondly, the resin ink is uniformly applied to computer engraving templates provided with groove patterns by a scraper; thirdly, redundant resin ink, except that at the groove patterns on the templates, is scraped away; fourthly, the air pressure of the transfer printing machine is adjusted to be 3-4 kg/cm$^2$; fifthly, the resin ink at the groove patterns on the templates is adsorbed by a circular silica gel transfer printing head on the transfer printing machine and the patterns are transferred to the outer surfaces of the lenses; sixthly, redundant resin ink on the transfer printing head of the transfer printing machine is cleaned; and seventhly, the resin ink can be printed on the outer surfaces of the lenses after the resin ink is dried, and the area where the resin ink exists is the area within the pattern outline.

During the printing of the resin ink by the screen printer, screen printing templates are made of soft materials, take the shape of screen cloth, and have bending characteristic; patterns are arranged on the screen printing templates; pattern parts have permeability for the penetration of resin ink while the other parts of the screen printing templates are sealed without the ink penetrated. During the printing of the resin ink, firstly, water-soluble resin ink is filled into the screen printing templates; secondly, redundant resin ink, except that at the patterns on the templates, is scraped away; thirdly, the lenses are arranged under the templates; fourthly, the resin ink on the templates is pressurized on the lenses to avoid pattern off-tracking; fifthly, the resin ink at the patterns of the templates is uniformly applied to the lenses by the scraper; and sixthly, the resin ink can be printed on the outer surfaces of the lenses after the resin ink is dried, and the area where the resin ink exists is the area within the pattern outline.

According to the preferred embodiments of the invention, during the printing of the resin ink, a diluent can be added in time to reduce the concentration of the resin ink.

The invention has the advantages that:

(1) As for the pattern-coated lenses, patterns such as graphs, characters and house marks can be formed on lenses with different curved surfaces, dimensions or materials by the manufacturing processes, so that not only the design aesthetic feeling of products can be improved but also both lines of spectacles frames and those of the lenses are guaranteed to be uniform. Moreover, the counterfeiting of the products is avoided and the uniqueness of the products is realized.

(2) As for the lenses, when the patterns are formed by the manufacturing processes, images are transferred to the lenses through the templates by means of the specially prepared water-soluble resin ink. The specially prepared ink can prevent the adsorption of the vacuum electroplating layers, so as to produce patterns with better effect. Moreover, in the technical proposal of the vacuum electroplating films, a special multi-layer (four-layer) film vacuum electroplating method is adopted. As vacuum electroplating layers of a common vacuum electroplating method can result in the reduction of the transmittance of the lenses by 3 to 5 percent, chromatic aberration can be caused between portions which are subjected to vacuum electroplating and portions which are not subjected to vacuum electroplating when spectacles are worn, thus the vision is affected. However, as the multi-layer film vacuum electroplating method of the invention includes high-transmittance vacuum electroplating, the chromatic aberration caused by vacuum electroplating can be effectively reduced. It is indicated by experiments that the vacuum electroplating method of the invention can be used for pattern vacuum electroplating, which not only cannot cause the chromatic aberration of patterns but also can produce tens of colors (more in the future) with better effect by adjusting the vacuum electroplating colors.

(3) Clear patterns are formed on the lens by the manufacturing processes; the coating does not block the sight; and the coated lens is more beautiful and has the functions of radiation resistance and ultraviolet resistance. Moreover, the pattern printing and vacuum electroplating method for manufacturing the lens has simple and efficient processes and realizes the functions of the coated lens.

DETAILED DESCRIPTION OF THE PREFERRED EMBODIMENTS

Figure 1:
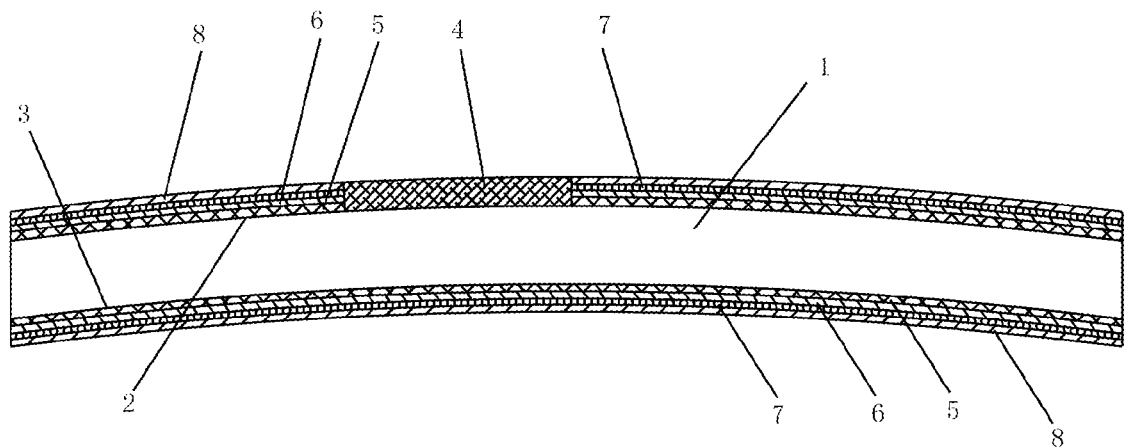
FIG. 1 is a schematic diagram of a pattern-coated lens of the invention after coating.
Figure 2:
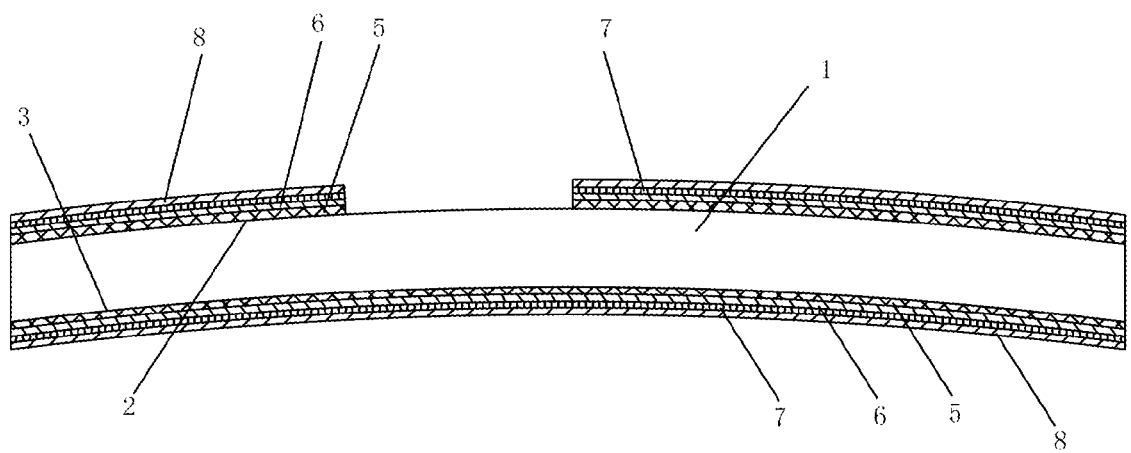
FIG. 2 is a structure diagram of the pattern-coated lens of the invention.

As illustrated in FIG. 1 and FIG. 2, the invention relates to a lens. The lens 1 comprises an outer surface 2 and an inner surface 3, wherein a pattern outline is printed on the outer surface 2; an argon gas layer 5, a high refractive index layer 6, a low refractive index layer 7 and a waterproof layer 8 are evaporated at an area, outside the pattern outline, of the outer surface 2 from inside to outside in turn; and an argon gas layer 5, a high refractive index layer 6, a low refractive index layer 7 and a waterproof layer 8 can also be coated on the inner surface 3 of the lens 1 from inside to outside in turn as required. During the evaporation of the outer surface 2 of the lens, the pattern outline is set by printing resin ink 4 on the outer surface 2 of the lens; the high refractive index layer 6 is zirconium dioxide; the low refractive index layer 7 is silicon dioxide; and the waterproof layer 8 is a water-drawing agent.

Figure 3:
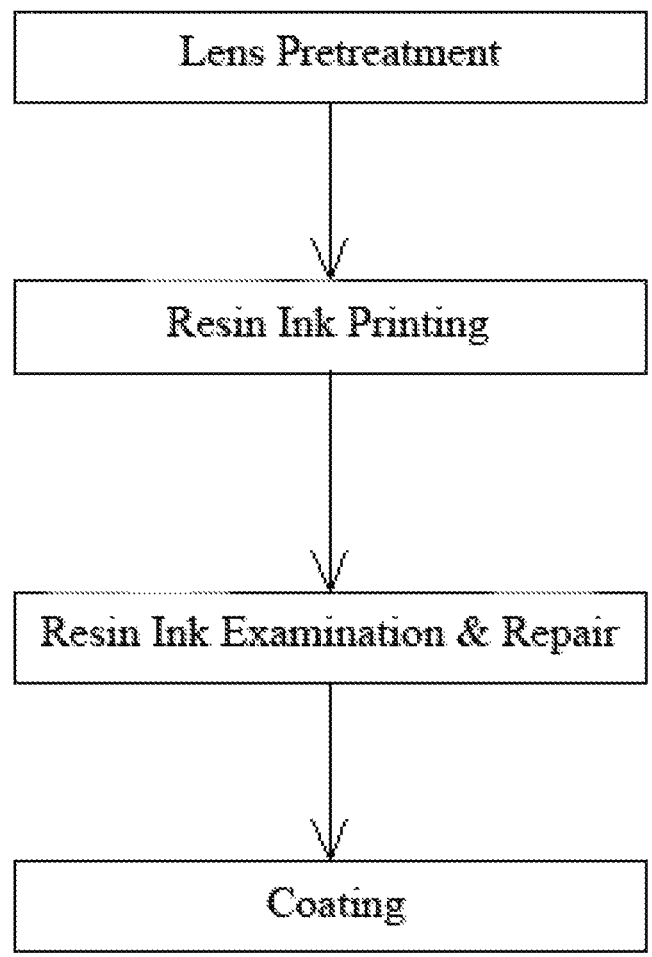
FIG. 3 is a flowchart of a method for manufacturing the coated lens illustrated in FIG. 2.

As illustrated in FIG. 3, the pattern printing and coating method for manufacturing the lens comprises the following steps of:

step 1: pretreatment of lenses 1, wherein outer surfaces 2 and inner surfaces 3 of the lenses are examined; and dust, fingerprints and dirt of the lenses 1 must be removed from the lenses 1 besides finding out defective lenses 1, so as to avoid the defects of light leakage and ink leakage after printing;

step 2: printing of resin ink 4, wherein pattern outlines are set by printing the resin ink 4 on the outer surfaces 2 of the lenses through a transfer printing machine or a screen printer;

step 3: examination and repair of the resin ink 4 printed, wherein whether the resin ink 4 has the defects of missing print, ink leakage, unclear border lines, uneven edges and ghosting is examined, and the defects are properly repaired and cleaned by a repair tool;

step 4: coating at areas, outside the pattern outlines, of the outer surfaces 2 of the lenses, wherein argon gas layers 5, high refractive index layers 6, low refractive index layers 7 and waterproof layers 8 are evaporated at the areas, outside the pattern outlines, of the outer surfaces 2 of the lenses from inside to outside in turn in a vacuum coating machine; and step 5: ultrasonic cleaning, wherein the lens 1 is subjected to ultrasonic cleaning in filtered and clean cold water first and then cleaned in hot water to remove the resin ink 4 on the outer surface 2.

As a more specific implementation, in the step 4, during the coating at the areas, outside the pattern outlines, of the outer surfaces 2 of the lenses, firstly, the lenses 1 for coating are arranged towards the outer surfaces 2; secondly, vacuum pumping is performed by an electrostatic gun for 20 to 35 minutes; and thirdly, coating is performed under the vacuum pressure of $1.0 \times 10^{-5}$, wherein argon gas is evaporated by an ion gun for 3 to 8 minutes for first layers; high refractive index materials are evaporated for 5 to 10 minutes for second layers; low refractive index materials are evaporated for 3 to 8 minutes for third layers; and waterproof materials are evaporated for 2 to 6 minutes for fourth layers.

In the step 4, argon gas layers 5, high refractive index layers 6, low refractive index layers 7 and waterproof layers 8 can also be evaporated on the inner surfaces 3 of the lenses from inside to outside in turn in the vacuum coating machine.

As a double coating embodiment of the lenses 1, in the step 4, during the vapor deposition of the outer surfaces 2 and the inner surfaces 3 of the lenses, firstly, the argon gas layers 5, the high refractive index layers 6 and the low refractive index layers 7 are evaporated on the firstly evaporated surfaces of the lenses 1; secondly, the argon gas layers 5, the high refractive index layers 6, the low refractive index layers 7 and the waterproof layers 8 are evaporated on the other surfaces of the lenses; and thirdly, the waterproof layers 8 are evaporated on the firstly evaporated surfaces of the lenses 1.

Two preferred embodiments are as follows:

The first embodiment is as follows: during the vapor deposition of the outer surfaces 2 and the inner surfaces 3 of the lenses, firstly, the lenses for coating are arranged towards the outer surfaces; secondly, vacuum pumping is performed by the electrostatic gun for 20 to 35 minutes; thirdly, coating is performed under the vacuum pressure of $1.0 \times 10^{-5}$, wherein the argon gas is evaporated by the ion gun for 3 to 8 minutes for the first layers; the high refractive index materials are evaporated for 5 to 10 minutes for the second layers; the low refractive index materials are evaporated for 3 to 8 minutes for the third layers; the obtained product is for standby; fourthly, the lenses are arranged towards the inner surfaces; fifthly, dust is removed by the electrostatic gun; sixthly, vacuum pumping is performed in an electroplating furnace for 20 to 35 minutes; seventhly, coating is performed under the vacuum pressure of $1.0 \times 10^{-5}$, wherein the argon gas is evaporated by the ion gun for 3 to 8 minutes for first layers; the high refractive index materials are evaporated for 5 to 10 minutes for second layers; the low refractive index materials are evaporated for 5 to 10 minutes for third layers; the waterproof materials are evaporated for 2 to 6 minutes for fourth layers; eighthly, the lenses are arranged towards the outer surfaces; ninthly, dust is removed by the electrostatic gun; tenthly, vacuum pumping is performed for 12 to 18 minutes; and eleventhly, the waterproof materials are evaporated for 2 to 6 minutes under the vacuum pressure of $2.0 \times 10^{-5}$.

The second embodiment is as follows: during the vapor deposition of the outer surfaces 2 and the inner surfaces 3 of the lenses, firstly, the lenses are arranged towards the inner surfaces 3; dust is removed by the electrostatic gun; vacuum pumping is performed in the vacuum electroplating furnace for 20 to 35 minutes; coating is performed under the vacuum pressure of $1.0 \times 10^{-5}$, wherein the argon gas is evaporated by the ion gun for 3 to 8 minutes for the first layers; the high refractive index materials are evaporated for 5 to 10 minutes for the second layers; the low refractive index materials are evaporated for 5 to 10 minutes for the third layers; and the obtained product is for standby.

Secondly, the lenses for coating are arranged towards the outer surfaces (inverted); vacuum pumping is performed by the electrostatic gun for 20 to 35 minutes; coating is performed under the vacuum pressure of $1.0 \times 10^{-5}$, wherein the argon gas is evaporated by the ion gun for 3 to 8 minutes for the first layers; the high refractive index materials are evaporated for 5 to 10 minutes for the second layers; the low refractive index materials are evaporated for 3 to 8 minutes for the third layers; and the waterproof materials are evaporated for 2 to 6 minutes for the fourth layers.

Thirdly, the lenses are arranged towards the inner surfaces 3; dust is removed by the electrostatic gun; vacuum pumping is performed for 12 to 18 minutes; and the waterproof materials are evaporated for 2 to 6 minutes under the vacuum pressure of $2.0 \times 10^{-5}$.

Moreover, before the pretreatment of the lenses 1 in the step 1, the lenses 1 can also be soaked in an antifogging agent and taken out and dried, so as to have the antifogging function.

During the printing of the resin ink 4 in the pattern outlines in the step 2, the resin ink is printed on small-size lenses 1 by the transfer printing machine and on large-size lenses 1 by the screen printer.

During the printing of the resin ink 4 by the transfer printing machine, firstly, water-soluble resin ink is filled into a standby ink groove for the transfer printing machine; secondly, the resin ink is uniformly applied to computer engraving templates provided with groove patterns by a scraper; thirdly, redundant resin ink, except that at the groove pattern on the template, is scraped away; fourthly, the air pressure of the transfer printing machine is adjusted to be 3-4 kg/cm$^2$; fifthly, the resin ink at the groove patterns on the templates is adsorbed by a circular silica gel transfer printing head on the transfer printing machine and the patterns are transferred to the outer surfaces of the lenses; sixthly, redundant resin ink on the transfer printing head of the transfer printing machine is cleaned; and seventhly, the resin ink 4 can be printed on the outer surfaces 2 of the lenses after the resin ink is dried, and the area where the resin ink exists is the area within the pattern outline.

During the printing of the resin ink 4 by the screen printer, screen printing templates are made of soft materials, take the shape of screen cloth, and have bending characteristic; patterns are arranged on the screen printing templates; pattern parts have permeability for the penetration of resin ink while the other parts of the screen printing templates are sealed without the ink penetrated. During the printing of the resin ink 4, firstly, water-soluble resin ink is filled into the screen printing templates; secondly, redundant resin ink, except that at the patterns on the templates, is scraped away; thirdly, the lenses 1 are arranged under the templates; fourthly, the resin ink on the templates is pressurized on the lenses 1 to avoid pattern off-tracking; fifthly, the resin ink at the patterns of the templates is uniformly applied to the lenses 1 by the scraper; and sixthly, the resin ink 4 can be printed on the outer surfaces 2 of the lenses after the resin ink is dried, and the area where the resin ink exists is the area within the pattern outline.

As a preferred embodiment, during the printing of the resin ink 4, a diluent can be added in time to reduce the concentration of resin ink.

In the step 5, the lens 1 is subjected to ultrasonic cleaning for 3 to 5 minutes in filtered and clean cold water first and then cleaned for 30 to 50 seconds in 75-80 DEG hot water to remove the resin ink 4 on the outer surface 2.

In the manufacturing method, the high refractive index layer 6 is zirconium dioxide; the low refractive index layer 7 is silicon dioxide; and the waterproof layer 8 is a water-drawing agent.

What is claimed is:

1. A lens, the lens comprising an outer surface and an inner surface,
    wherein a pattern outline printed on the outer surface; and an argon gas layer, a high refractive index layer, a low refractive index layer and a waterproof layer evaporated at an area, outside the pattern outline, of the outer surface from inside to outside in turn,
    wherein an argon gas layer, a high refractive index layer, a low refractive index layer and a waterproof layer are coated on the inner surface of the lens from inside to outside in turn,
    wherein the pattern outline is set by printing resin ink on the outer surface of the lens during the evaporation of the outer surface of the lens;
    the high refractive index layer is zirconium dioxide;
    the low refractive index layer is silicon dioxide; and the waterproof layer is a water-drawing agent.

2. A pattern printing and coating method for manufacturing the lens, comprising the following steps of:
    step 1: pretreatment of lenses, wherein outer surfaces and inner surfaces of the lenses are examined; and dust, fingerprints and dirt must be removed from the lenses besides finding out defective lenses, so as to avoid the defects of light leakage and ink leakage after printing;
    step 2: printing of resin ink, wherein pattern outlines are set by printing the resin ink on the outer surfaces of the lenses through a transfer printing machine or a screen printer;
    step 3: examination and repair of the resin ink printed, wherein whether the resin ink has the defects of missing print, ink leakage, unclear border lines, uneven edges and ghosting is examined, and the defects are properly repaired and cleaned by a repair tool;
    step 4: coating at areas, outside the pattern outlines, of the outer surfaces of the lenses, wherein argon gas layers, high refractive index layers, low refractive index layers and waterproof layers are evaporated at the areas, outside the pattern outlines of the outer surfaces of the lenses from inside to outside in turn in a vacuum coating machine;
    wherein in the step 4, during the coating at the areas, outside the pattern outlines, of the outer surfaces of the lenses,
    firstly, the lenses for coating are arranged towards the outer surfaces;
    secondly, vacuum pumping is performed by an electrostatic gun for 20 to 35 minutes; and
    thirdly, coating is performed under a vacuum pressure of $1.0 \times 10^{-5}$, wherein argon gas is evaporated by an ion gun for 3 to 8 minutes for first layers;
    high refractive index materials are evaporated for 5 to 10 minutes for second layers;
    low refractive index materials are evaporated for 3 to 8 minutes for third layers; and
    waterproof materials are evaporated for 2 to 6 minutes for fourth layers; and
    step 5: ultrasonic cleaning, wherein the lens is subjected to ultrasonic cleaning in filtered and clean cold water first and then cleaned in hot water to remove the resin ink on the outer surface.

3. The pattern printing and coating method for manufacturing the lens according to claim 2,
    wherein before the pretreatment of the lenses in the step 1, the lenses are soaked in an antifogging agent and taken out and dried, so as to have the antifogging function.

4. The pattern printing and coating method for manufacturing the lens according to claim 3,
    wherein during the printing of the resin ink, a diluent can be added in time to reduce the concentration of the resin ink.

5. A pattern printing and coating method for manufacturing the lens, comprising the following steps of:
    step 1: pretreatment of lenses, wherein outer surfaces and inner surfaces of the lenses are examined; and dust, fingerprints and dirt must be removed from the lenses besides finding out defective lenses, so as to avoid the defects of light leakage and ink leakage after printing;
    step 2: printing of resin ink, wherein pattern outlines are set by printing the resin ink on the outer surfaces of the lenses through a transfer printing machine or a screen printer;
    step 3: examination and repair of the resin ink printed, wherein whether the resin ink has the defects of missing print, ink leakage, unclear border lines, uneven edges and ghosting is examined, and the defects are properly repaired and cleaned by a repair tool;
    step 4: coating at areas, outside the pattern outlines, of the outer surfaces of the lenses, wherein argon gas layers, high refractive index layers, low refractive index layers and waterproof layers are evaporated at the areas, outside the pattern outlines of the outer surfaces of the lenses from inside to outside in turn in a vacuum coating machine;
    wherein in the step 4, the argon gas layers, the high refractive index layers, the low refractive index layers and the waterproof layers are evaporated on the inner surfaces of the lenses from inside to outside in turn in the vacuum coating machine;
    wherein in the step 4, during the vapor deposition of the outer surfaces and the inner surfaces of the lenses,
    firstly, the argon gas layers, the high refractive index layers and the low refractive index layers are evaporated on the firstly evaporated surfaces of the lenses;
    secondly, the argon gas layers, the high refractive index layers, the low refractive index layers and the waterproof layers are evaporated on the other surfaces of the lenses; and
    thirdly, the waterproof layers are evaporated on the firstly evaporated surfaces of the lenses;
    wherein in the step 4, during the vapor deposition of the outer surfaces and the inner surfaces of the lenses,
    firstly, the lenses for coating are arranged towards the outer surfaces;
    vacuum pumping is performed by the electrostatic gun for 20 to 35 minutes;
    coating is performed under the vacuum pressure of $1.0 \times 10^{-5}$,
    wherein the argon gas is evaporated by an ion gun for 3 to 8 minutes for the first layers;

the high refractive index materials are evaporated for 5 to 10 minutes for the second layers;
the low refractive index materials are evaporated for 3 to 8 minutes for the third layers; and
the obtained product is for standby;
secondly, the lenses are arranged towards the inner surfaces;
dust is removed by the electrostatic gun;
vacuum pumping is performed in an electroplating furnace for 20 to 35 minutes;
coating is performed under the vacuum pressure of $1.0 \times 10^{-5}$,
wherein the argon gas is evaporated by the ion gun for 3 to 8 minutes for first layers;
the high refractive index materials are evaporated for 5 to 10 minutes for second layers;
the low refractive index materials are evaporated for 5 to 10 minutes for third layers; and
the waterproof materials are evaporated for 2 to 6 minutes for fourth layers; and
thirdly, the lenses are arranged towards the outer surfaces;
dust is removed by the electrostatic gun;
vacuum pumping is performed for 12 to 18 minutes; and
the waterproof materials are evaporated for 2 to 6 minutes under the vacuum pressure of $2.0 \times 10^{-5}$; and
step 5: ultrasonic cleaning, wherein the lens is subjected to ultrasonic cleaning in filtered and clean cold water first and then cleaned in hot water to remove the resin ink on the outer surface.

6. A pattern printing and coating method for manufacturing the lens, comprising the following steps of:
step 1: pretreatment of lenses, wherein outer surfaces and inner surfaces of the lenses are examined; and dust, fingerprints and dirt must be removed from the lenses besides finding out defective lenses, so as to avoid the defects of light leakage and ink leakage after printing;
step 2: printing of resin ink, wherein pattern outlines are set by printing the resin ink on the outer surfaces of the lenses through a transfer printing machine or a screen printer;
wherein during the printing of the resin ink in the pattern outlines in the step 2, the resin ink is printed on small-size lenses by the transfer printing machine and on large-size lenses by the screen printer;
during the printing of the resin ink by the transfer printing machine,
firstly, water-soluble resin ink is filled into a standby ink groove for the transfer printing machine;
secondly, the resin ink is uniformly applied to computer engraving templates provided with groove patterns by a scraper;
thirdly, redundant resin ink, except that at the groove patterns on the templates, is scraped away;
fourthly, the air pressure of the transfer printing machine is adjusted to be 3-4kg/cm$^2$;
fifthly, the resin ink at the groove patterns on the templates is adsorbed by a circular silica gel transfer printing head on the transfer printing machine, and the patterns are transferred to the outer surfaces of the lenses;
sixthly, the redundant resin ink on the transfer printing head of the transfer printing machine is cleaned; and
seventhly, the resin ink can be printed on the outer surfaces of the lenses after the resin ink is dried, and the area where the resin ink exists is the area within the pattern outline;
during the printing of the resin ink by the screen printer, screen printing templates are made of soft materials, take the shape of screen cloth, and have bending characteristic;
patterns are arranged on the screen printing templates;
pattern parts have permeability for the penetration of resin ink while the other parts of the screen printing templates are sealed without the ink penetrated;
during the printing of the resin ink,
firstly, water-soluble resin ink is filled into the screen printing templates;
secondly, the redundant resin ink, except that at the patterns on the templates, is scraped away;
thirdly, the lenses are arranged under the templates;
fourthly, the resin ink on the templates is pressurized on the lenses to avoid pattern off-tracking;
fifthly, the resin ink at the patterns of the templates is uniformly applied to the lenses by the scraper; and
sixthly, the resin ink can be printed on the outer surfaces of the lenses after the resin ink is dried, and the area where the resin ink exists is the area within the pattern outline;
step 3: examination and repair of the resin ink printed, wherein whether the resin ink has the defects of missing print, ink leakage, unclear border lines, uneven edges and ghosting is examined, and the defects are properly repaired and cleaned by a repair tool;
step 4: coating at areas, outside the pattern outlines, of the outer surfaces of the lenses, wherein argon gas layers, high refractive index layers, low refractive index layers and waterproof layers are evaporated at the areas, outside the pattern outlines of the outer surfaces of the lenses from inside to outside in turn in a vacuum coating machine; and
step 5: ultrasonic cleaning, wherein the lens is subjected to ultrasonic cleaning in filtered and clean cold water first and then cleaned in hot water to remove the resin ink on the outer surface.

* * * * *